United States Patent
Chen et al.

(10) Patent No.: US 7,881,137 B2
(45) Date of Patent: Feb. 1, 2011

(54) READ ASSIST FOR MEMORY CIRCUITS WITH DIFFERENT PRECHARGE VOLTAGE LEVELS FOR BIT LINE PAIR

(75) Inventors: Nan Chen, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 177 days.

(21) Appl. No.: 12/256,569

(22) Filed: Oct. 23, 2008

(65) Prior Publication Data
US 2010/0103755 A1     Apr. 29, 2010

(51) Int. Cl.
*G11C 7/00*     (2006.01)
(52) U.S. Cl. .................................................. 365/203
(58) Field of Classification Search ............. 365/203
See application file for complete search history.

(56) References Cited

U.S. PATENT DOCUMENTS

| | | | |
|---|---|---|---|
| 5,864,511 A | 1/1999 | Sato | |
| 5,875,139 A | 2/1999 | Semi | |
| 6,282,137 B1 | 8/2001 | Lee | |
| 6,608,788 B2 * | 8/2003 | Ma et al. | 365/203 |
| 7,327,610 B2 * | 2/2008 | Choi et al. | 365/203 |
| 7,684,271 B2 * | 3/2010 | Won | 365/203 |
| 2008/0181038 A1 | 7/2008 | Clinton | |

OTHER PUBLICATIONS

International Search Report-PCT/US2009/061411, International Search Authority—European Patent Office Dec. 28, 2009.
Written Opinion-PCT/US2009/061411, International Search Authority—European Patent Office Dec. 28, 2009.

* cited by examiner

*Primary Examiner*—VanThu Nguyen
(74) *Attorney, Agent, or Firm*—Michelle Gallardo; Nicholas J. Pauley; Jonathan T. Velasco (57) ABSTRACT

A method increases stability of a memory circuit by pre-charging at least one bit line of the memory circuit to a first voltage, pre-charging at least one other bit line of the memory circuit to a second voltage, and equalizing charge across the bit lines so that the bit lines are pre-charged with a third voltage.

17 Claims, 6 Drawing Sheets

FIG. 1

Prior Art

READ ASSIST FOR MEMORY CIRCUITS WITH DIFFERENT PRECHARGE VOLTAGE LEVELS FOR BIT LINE PAIR

TECHNICAL FIELD

The present disclosure generally relates to memory circuitry. More specifically, the present disclosure relates to providing power for read operations in SRAM circuits and, even more specifically, to providing precharge voltage to bit lines for read operations.

BACKGROUND

Various types of semiconductor memory exist. One type of volatile semiconductor memory is Static Random Access Memory (SRAM). SRAM modules, and their memory cells, have become very small. The small size of the cells has led to stability issues.

Figure 1:
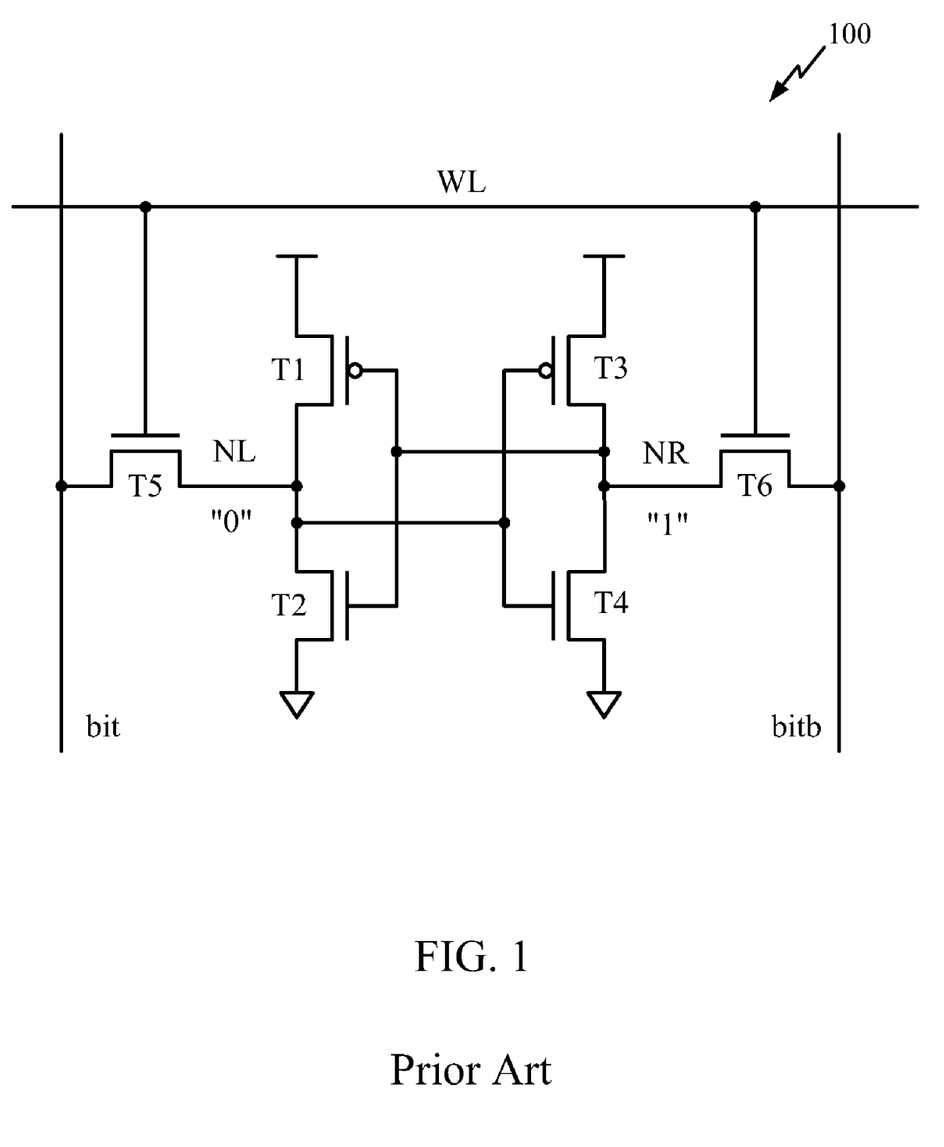
FIG. 1 is a circuit diagram illustrating a system, which includes a conventional memory cell.

One such stability issue is read failures caused by high supply voltages (Vdd). FIG. 1 is an illustration of system 100, which includes a conventional memory cell having a bit line BL, a complementary bit line BL_, a wordline WL, and transistors T1, T2, T3, T4, T5, T6. In this example, system 100 stores a value of 0 at node NL and a value of 1 at node NR.

Prior to a read operation, the bit lines BL, BL_ are precharged to a supply voltage Vdd. During the read operation, the word line (WL) turns on and the voltage at node NL rises. The increase is an amount based upon a ratio between the transistors T5 and T2 and the supply voltage Vdd (due to channel resistance of the transistors T5 and T2). If the supply voltage Vdd is too high, the voltage at node NL surpasses the trip point of the T3, T4 inverter, the latch loses its state, and a read failure occurs.

It is known that read stability can be enhanced by decreasing the precharge voltage applied to the bit lines prior to accessing the bit cell (i.e. enabling the wordline WL). However, a challenge is how to reduce the precharge voltage.

Figure 2:
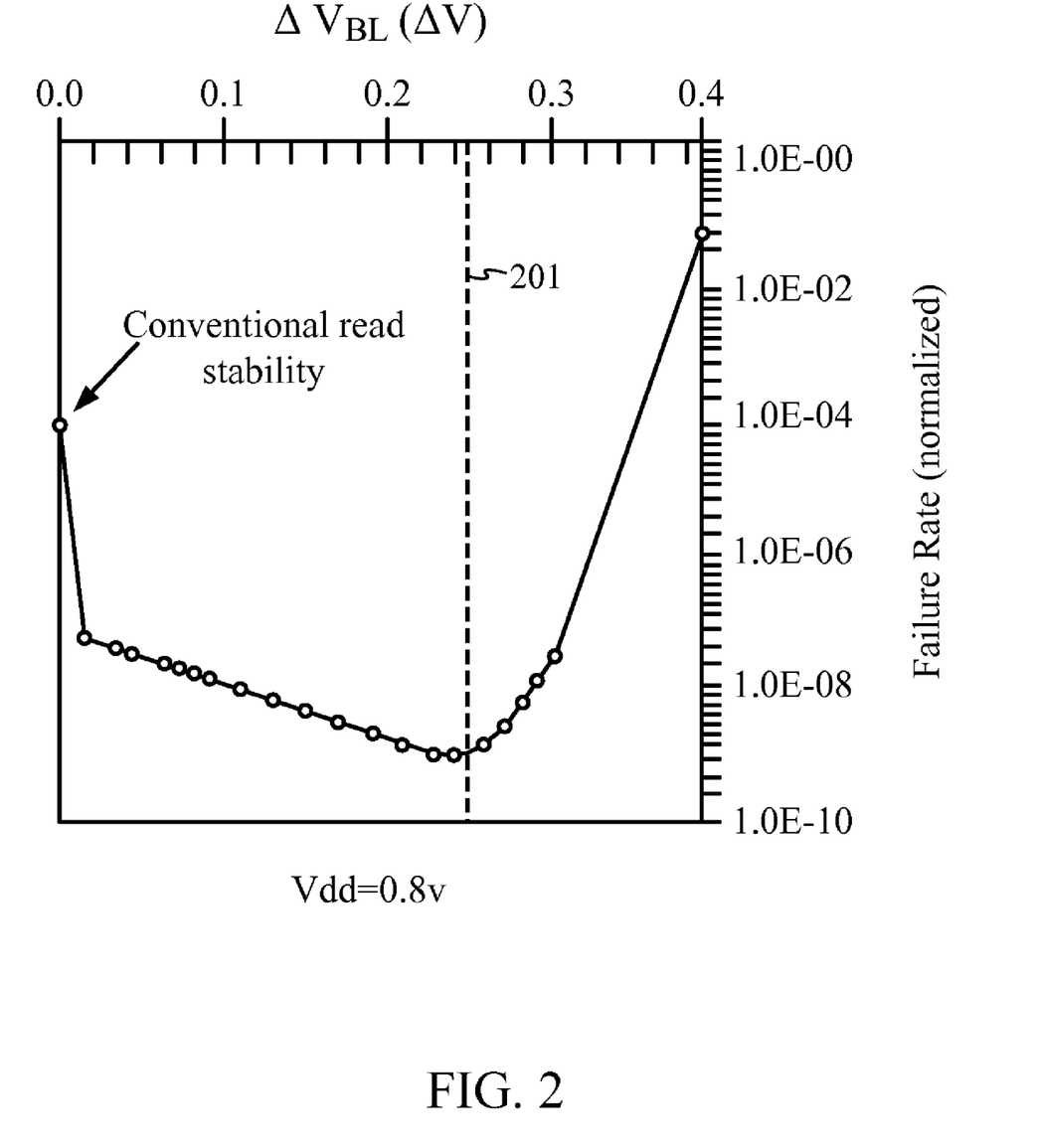
FIG. 2 is graph showing an example illustration of failure rate versus precharge voltage drop (ΔV) for a conventional memory cell, such as that shown in FIG. 1.

FIG. 2 is graph showing an example illustration of failure rate versus precharge voltage drop (ΔV) for a conventional memory cell, such as that of system 100 of FIG. 1. FIG. 2 shows that as the precharge voltage is dropped (i.e., as ΔV gets bigger), the failure rate decreases and then increases again. Point 201 shows the precharge voltage drop with the highest stability (and highest Static Noise Margin (SNM)) in this example.

One particular prior art solution proposes using a voltage regulator circuit to lower the precharge voltage from Vdd. However, voltage regulator circuits are complex and expensive. Another solution proposes a diode drop for reducing the precharge voltage from Vdd. However, a diode drop will reduce the voltage by too much, increasing the failure rate.

Another proposed solution includes using two power supplies for the memory—one for the bit cell and one for the periphery. Complexity is added, however, because the voltage difference between the two power supplies requires strict limitation due to possible SNM degradation when the difference gets too high. Also, the limitation on the voltage level differences establishes a limit on the power savings that can be achieved by reducing the voltage of the periphery power supply.

The prior art provides no low-cost and simple solution for decreasing bit line precharge voltages to reduce read failures.

BRIEF SUMMARY

Various embodiments of the disclosure include systems and methods for providing memory circuit stability by applying first and second precharge voltages to the bit lines of a memory circuit, where the second voltage is less than the first voltage. Before the read operation is performed, the voltages at the bit lines are shorted to each other, thereby resulting in a precharge voltage lower than the first voltage. The system then performs the read operation. In the example embodiments herein, the lower precharge voltage level increases stability by lowering the voltage that is seen by the inverters in the memory bitcells (e.g., the voltage at NL of FIG. 1). Equalizing can be performed by circuits that are less expensive than prior art solutions.

Embodiments of the disclosure can provide the first and second voltages in any of a variety of ways. In one example, a voltage drop circuit is disposed at one of the bit lines to cause a drop in the initial precharge voltage. In another example, separate supply voltages are applied to the bit lines, with one supply voltage being lower than the other. Furthermore, embodiments can be adapted for memory circuits with any number of bit lines (e.g., four, eight, or more).

The foregoing has outlined rather broadly features and technical advantages in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 3:
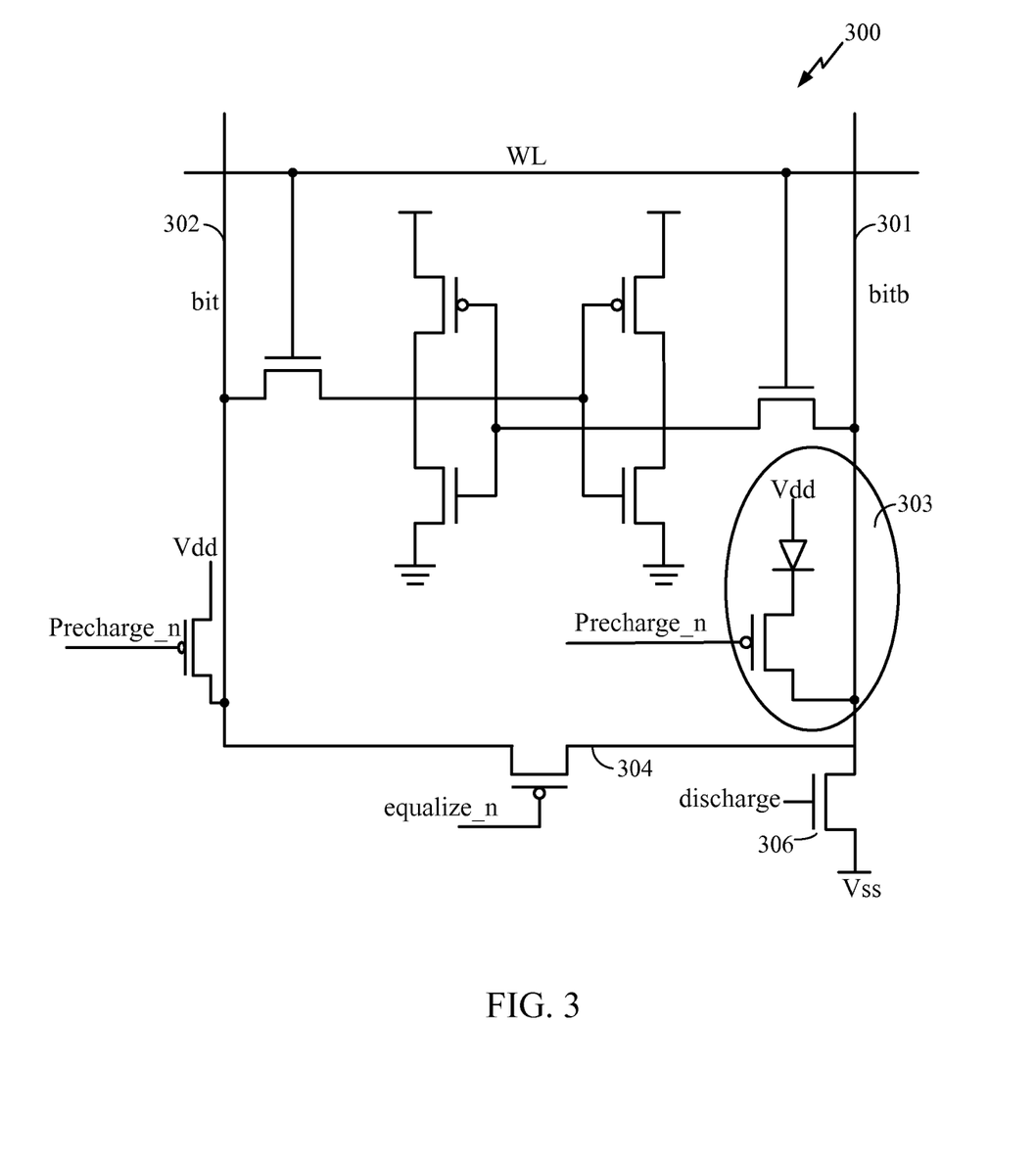
FIG. 3 is a circuit diagram illustrating an exemplary system adapted according to one embodiment of the disclosure.

FIG. 3 is an illustration of exemplary system 300 adapted according to one embodiment of the disclosure. System 300 includes a memory circuit with complementary bit line 301 and bit line 302, which are precharged before a read operation is performed.

In the present illustration, during precharging Vdd is applied to bit line 302. Complementary bit line 301 receive its voltage from a precharge circuit having a diode drop circuit 303, which receives Vdd and drops the voltage by a known amount. In one example, Vdd is 1.2V, and diode drop circuit 303 is designed to provide a drop of 0.5V. Thus, precharge begins by applying 1.2V to bit line 302 and applying 0.7V to complementary bit line 301. Although specific voltages are described as applied to complementary bit line 301 and bit line 302, the specific voltages can be reversed. For example, the diode drop circuit 303 can communicate with bit line 302, instead of complementary bit line 301.

After the two voltages are applied to bit lines 301 and 302, equalization circuit 304 is turned on, thereby shorting bit lines 301 and 302 together. Charge sharing occurs. The voltage on bit lines 301 and 302 after equalization is equal to the sum of the first and second voltages divided by two, which is less than Vdd. In the example above, the voltage after equalization is 0.95V, which is 0.25V less than Vdd.

The equalization circuit shorts bit lines 301 and 302 together in response to an equalize signal, which occurs after precharge is complete. In one embodiment, an equalize_n signal is a short pulse that occurs when a precharge_n signal is de-asserted. After the equalize_n pulse completes (the charge sharing has completed), the word line WL is asserted and the read operation begins. In one embodiment, before the next pre-charge cycle begins, bit line 301 is discharged to ground using the a discharge circuit 306 to ensure bit line 301 can be pre-charged back to Vdd—the diode drop. That is, the bit line 301 will have been charged above Vdd—the diode drop after shorting during the previous cycle, and thus needs its charge reduced before it can be charged back up to Vdd—the diode drop. A discharge signal will turn on the transistor 306 to enable the discharge.

Various embodiments include designing diode drop circuit 303 such that the voltage difference after equalization minimizes (or at least reduces) read failures. The embodiment of FIG. 3 can be achieved using a single power supply; however, other embodiments can be achieved using more than one power supply.

Figure 4:
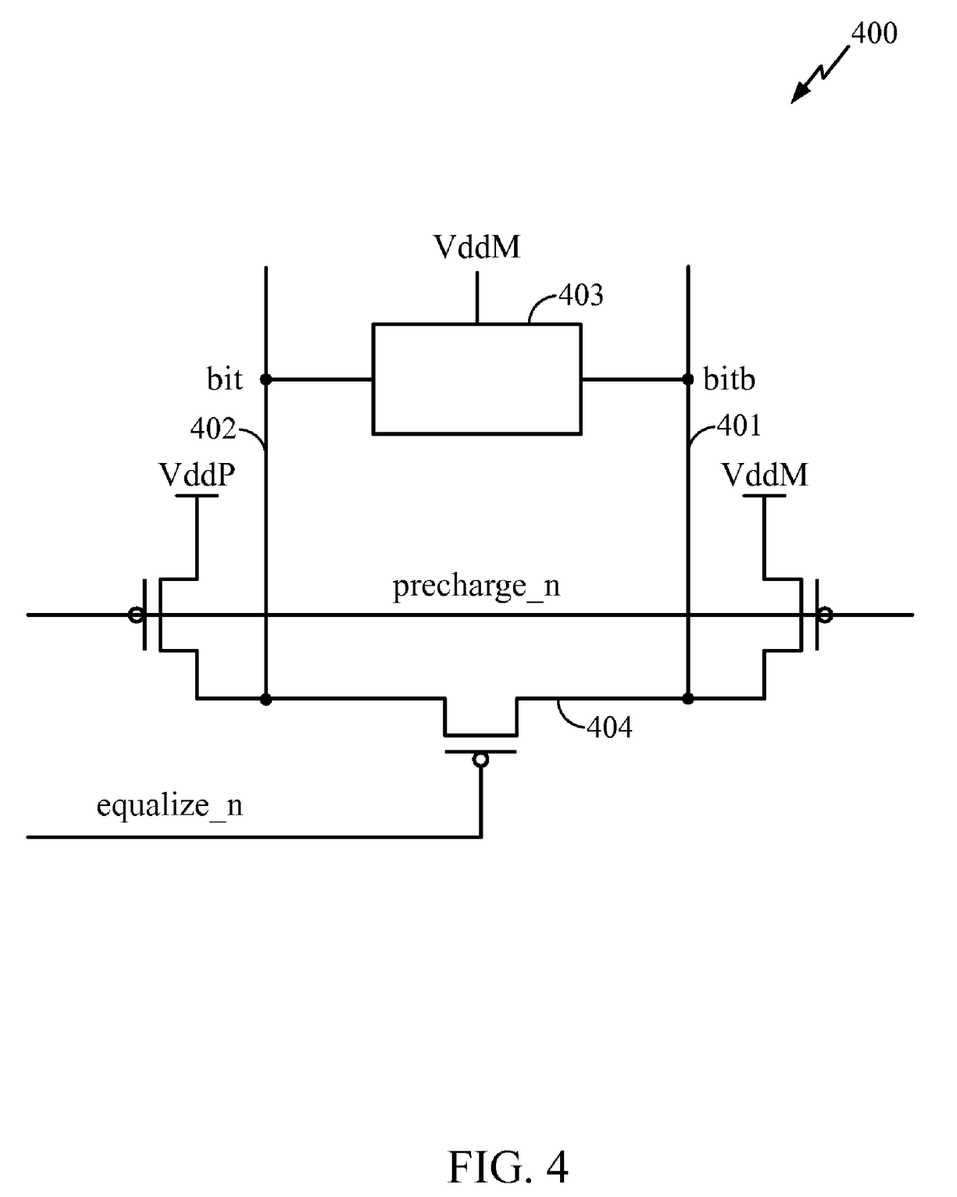
FIG. 4 is a circuit diagram illustrating an exemplary system adapted according to another embodiment of the disclosure.

FIG. 4 is an illustration of exemplary system 400 adapted according to another embodiment of the disclosure. System 400 can be achieved using two different power supplies—one for VddP and another for VddM. In system 400, VddP is the supply voltage, and VddM is a voltage higher than VddP that is used for bit cell 403.

At precharge, complementary bit line 401 is driven to voltage VddM, and bit line 402 is driven to voltage VddP (or vice versa). When equalization circuit 404 is turned on, it shorts bit lines 401 and 402 together, thereby driving bit lines 401 and 402 to an equalization voltage through charge sharing. As in the example of FIG. 3, the equalization voltage is equal to the sum of two bit line voltages VddP and VddM divided by two. When VddM is lower than VddP, the equalization voltage is also lower than VddP. Various embodiments include values for VddP and VddM that reduce or minimize read failures.

Figure 5:
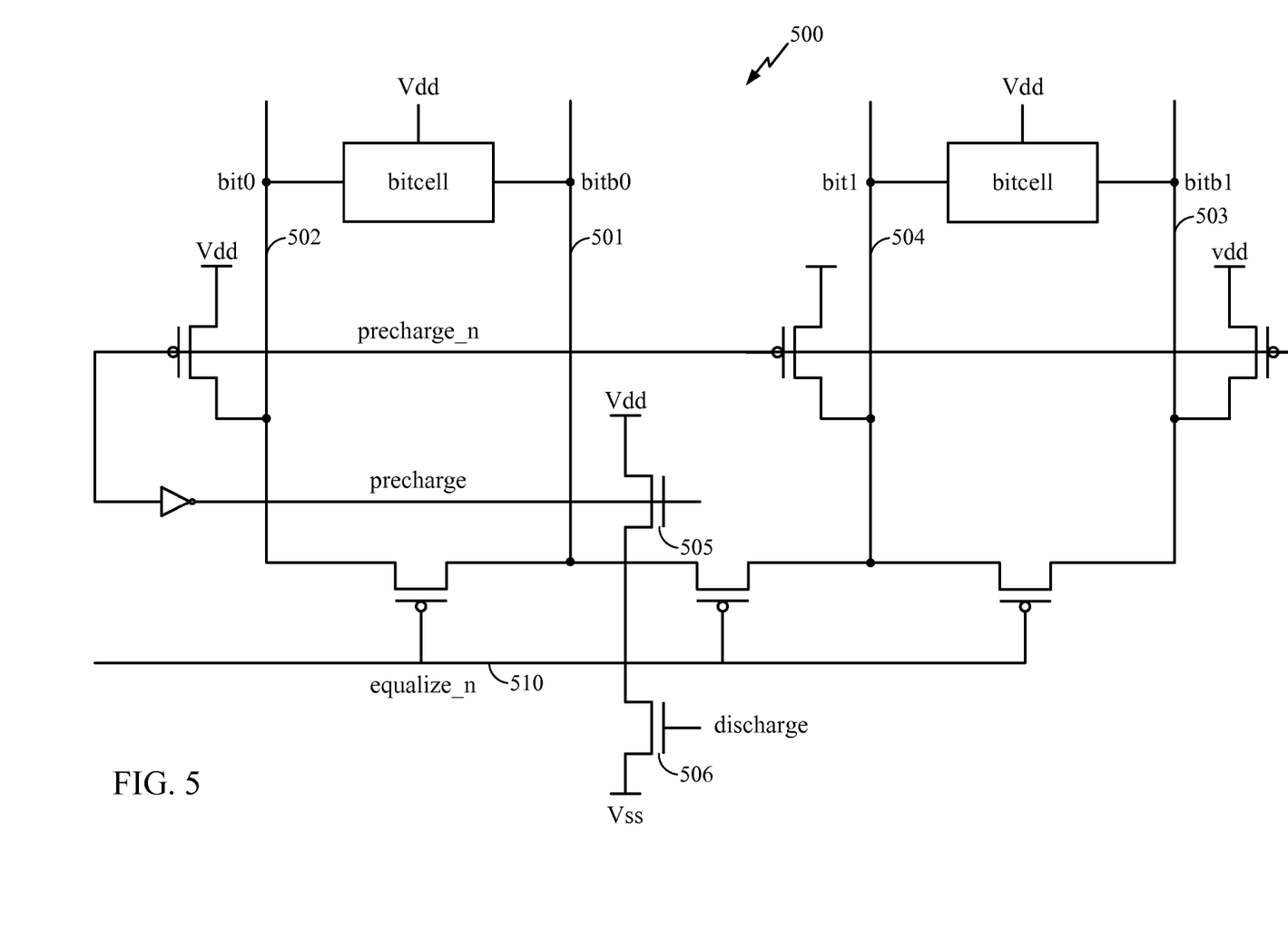
FIG. 5 is a circuit diagram illustrating an exemplary system adapted according to yet another embodiment of the disclosure.

Various embodiments can be applied to memory circuits with more than two bit lines. FIG. 5 is an illustration of exemplary system 500 adapted according to yet another embodiment of the disclosure. At precharge, bit lines 502-504 (bit0, bitb1, bit1) are driven to Vdd. Bit line 501 (bitb0) is precharged to Vdd—the threshold voltage of the NMOS 505 VthN. When equalization circuit 510 is turned on bit lines 501-504 are shorted together, and the resulting bit line voltage is equal to (4Vdd−VthN)/4. Various embodiments include values for Vdd and Vss that reduce or minimize read failures.

In one embodiment, before the pre-charge cycle begins, bitb0 501 is discharged to ground using a discharge circuit 506 to ensure bitb0 can be pre-charged back to Vdd−VthN. That is, bitb0 will have been charged up to (4Vdd−VthN)/4 after shorting during the previous cycle, and thus needs its charge reduced before it can be charged back up to Vdd−VthN. A discharge signal will turn on the transistor 506 to enable the discharge.

Furthermore, the concepts shown in FIGS. 3-5 can be adapted for use in memory circuits with more than four bit lines. For instance, system 500 can be scaled to four bit cells (eight bit lines), eight bit cells (sixteen bit lines), or more by coupling the bit lines to equalization circuit 510.

Figure 6:
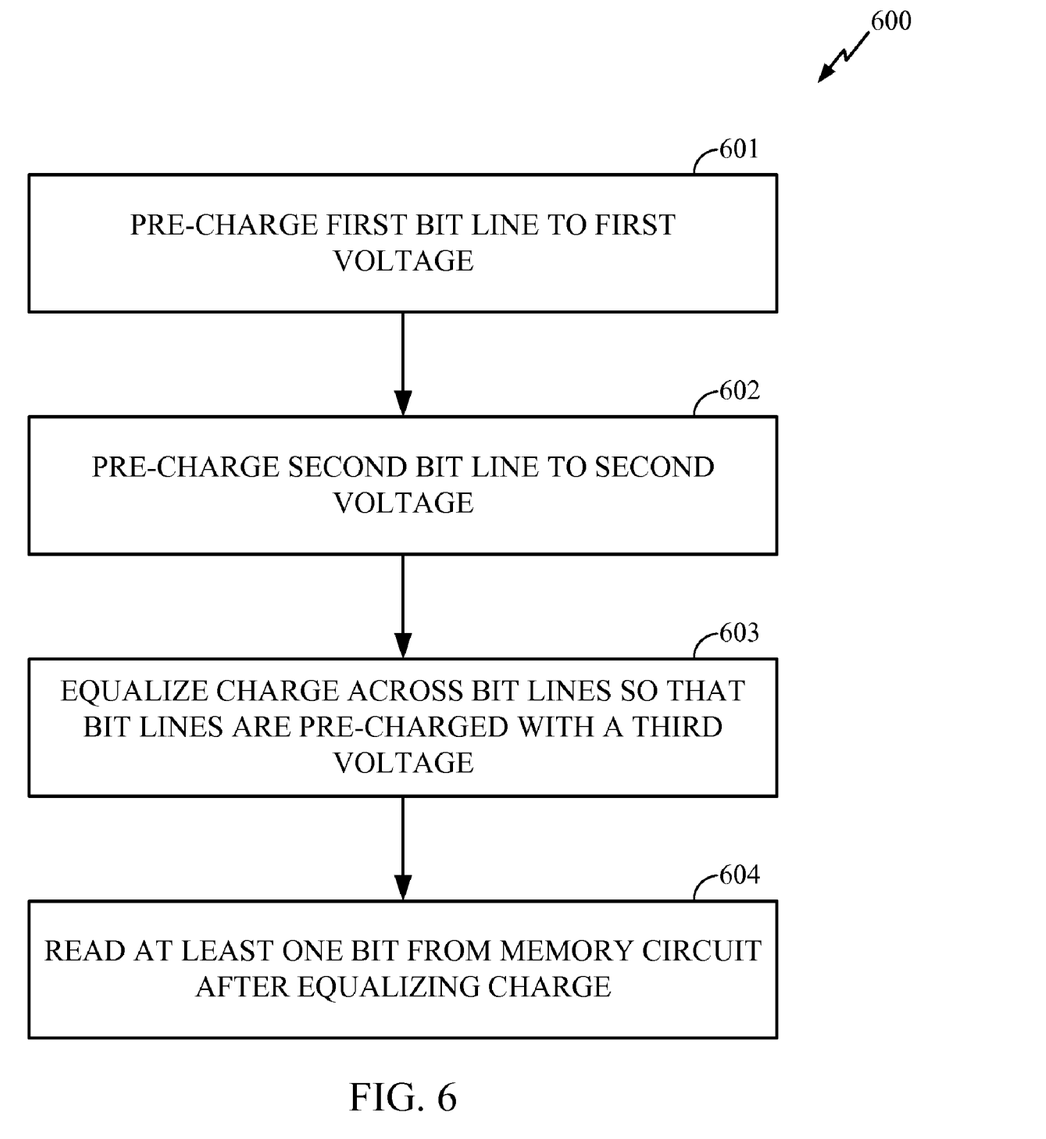
FIG. 6 is a flow chart illustrating an exemplary method adapted according to one embodiment of the disclosure.

FIG. 6 is an illustration of exemplary method 600 adapted according to one embodiment of the disclosure. Method 600 may be performed, for example, by a memory system employing SRAM. In one example, a memory controller (not shown) associated with a memory array controls voltages applied to bit lines, word lines, equalization lines, and the like to provide read and write operations. Method 600 may be performed on a memory circuit including any number 2n of bit lines (wherein n refers to the number of bits).

Block 601 includes pre-charging a first bit line of a memory circuit to a first voltage. Block 602 includes pre-charging a second bit line of a memory circuit to a second voltage. In this example, the second voltage is lower than the first voltage. In some embodiments, the first voltage is a circuit supply voltage, such as Vdd, and the second voltage is a separate supply voltage or a voltage derived from Vdd. Either way, the first and second bit lines are charged to two different potentials.

Block 603 includes equalizing charge across the bit lines so that the bit lines end up being pre-charged with a third voltage. For instance, the first and second bit lines can be shorted together with an equalization circuit, as shown in FIGS. 3-5. As noted above, some systems include an equalize_n pulse provided to a circuit soon after the bit lines have reached their first precharge levels. The equalize pulse turns on the equalization circuit, thereby shorting the bit lines. In many embodiments, the equalizing operation averages the voltages over the bit lines.

Block 604 includes reading at least one bit from the memory circuit after equalizing the charge. In fact, any number n of bits can be read from the memory circuit.

While method 600 is shown as a series of discrete blocks, the scope of embodiments is not so limited. Other embodiments may add, omit, rearrange, and/or modify the actions described above. For example, many embodiments perform blocks 601 and 602 at the same time. Furthermore, a memory controller may repeat the precharge equalization and read operations on the same or different memory circuits, as often as the bits are requested.

The present disclosure is not limited by the voltage levels discussed above with reference to FIGS. 2 and 3, as the concept can be applied to memory circuits of any voltage level. A given circuit design will have ideal values for pre-charge voltages, and such values can be taken into account when designing voltage drops and/or precharge levels. Furthermore, while FIG. 3 shows a six transistor (i.e., "6T") memory cell, other types of memory cells can be adapted for use in some embodiments, as well. Moreover, embodiments can also be used to increase a precharge voltage level by applying a higher voltage to one or more bit lines and then equalizing the bit lines.

Embodiments of the disclosure may provide one or more advantages over the prior art. For example, the equalization circuits shown in FIGS. 3-5 are usually cheaper in terms of area and power and easier to implement than voltage regulator circuits.

Although the present disclosure and its advantages have been described in detail, it should be understood that various changes, substitutions and alterations can be made herein without departing from the teachings of the disclosure as defined by the appended claims. For example, although SRAM has been described, the invention applies to other types of memory, such as Dynamic Random Access Memory (DRAM). Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for increasing stability of a memory circuit, the method comprising:
   pre-charging at least one bit line of the memory circuit to a first voltage;
   pre-charging at least one other bit line of the memory circuit to a second voltage using a diode drop at the at least one other bit line that drops the first voltage to the second voltage; and
   equalizing charge across the bit lines so that the bit lines are pre-charged with a third voltage.

2. The method of claim 1 wherein the first voltage is a supply voltage.

3. The method of claim 2 wherein the second voltage is lower than the supply voltage.

4. The method of claim 1 wherein the third voltage comprises an average of the first and the second voltages.

5. The method of claim 1 wherein the at least one bit line and the at least one other bit line have separate power supplies.

6. The method of claim 1 wherein the memory circuit includes a single bit line pair, the first voltage is applied to one bit line of the bit line pair, and the second voltage is applied to the other bit line of the bit line pair.

7. The method of claim 1 wherein the memory circuit includes four bit lines, the first voltage applied to three of the four bit lines, and the second voltage applied to a fourth of the bit lines.

8. The method of claim 1 further comprising: reading at least one bit from the memory circuit after equalizing the charge.

9. A method for increasing memory system stability, the method comprising:
   imposing on a first bit line of a bit line pair a first voltage less than a second voltage imposed on a second bit line of the bit line pair using a diode drop at the first bit line to lower the second voltage to the first voltage; and
   prior to an access of the memory system, equalizing potential across the first and second bit lines.

10. The method of claim 9 wherein the first and second voltages are supplied by different power supplies.

11. The method of claim 9 wherein the first and the second bit lines share a common power supply.

12. A memory system comprising:
    a memory cell having a bit line pair;
    a first precharge circuit impressing on a first bit line of the bit line pair a first voltage greater than a second voltage on a second bit line of the bit line pair;
    a second precharge circuit, comprising a diode that reduces the voltage from the first power supply, impressing on the second bit line of the bit line pair the second voltage; and
    an equalization circuit operative, prior to enabling an access of the memory system, for sharing potential across the bit line pair.

13. The memory system of claim 12, in which the first precharge circuit comprises a first power supply.

14. The memory system of claim 13, in which the second precharge circuit comprises a second power supply.

15. The memory system of claim 12, in which the equalization circuit comprises at least one transistor configured to short together the bit lines.

16. The memory system of claim 12, further comprising:
    a memory controller in communication with the memory circuit, the memory controller supplying pulses to activate the equalization circuit.

17. The memory system of claim 12, further comprising:
    an additional bit line pair, one bit line of the additional bit line pair receiving the second voltage and coupled to the equalization circuit such that the potential across the bit line pair and across the additional bit line pair is shared.

* * * * *

UNITED STATES PATENT AND TRADEMARK OFFICE
CERTIFICATE OF CORRECTION

| | | |
|---|---|---|
| PATENT NO. | : 7,881,137 B2 | Page 1 of 1 |
| APPLICATION NO. | : 12/256569 | |
| DATED | : February 1, 2011 | |
| INVENTOR(S) | : Chen et al. | |

It is certified that error appears in the above-identified patent and that said Letters Patent is hereby corrected as shown below:

Column 6, line 17, claim 10: "arc" to read as --are--

Column 6, line 26, claim 12: "the first" to read as --a first--

Column 6, line 33, claim 13: "a first" to read as --the first--

Signed and Sealed this
Sixth Day of September, 2011

David J. Kappos
*Director of the United States Patent and Trademark Office*